United States Patent [19]
Maeda et al.

[11] Patent Number: 4,967,386
[45] Date of Patent: Oct. 30, 1990

[54] SIMULATION METHOD FOR MODIFIABLE SIMULATION MODEL

[75] Inventors: Kazuhiko Maeda, Yokohama; Sadao Shimoyashiro, Fujisawa, both of Japan

[73] Assignee: Hitachi, Ltd., Tokyo, Japan

[21] Appl. No.: 340,890

[22] Filed: Apr. 19, 1989

[30] Foreign Application Priority Data

Apr. 22, 1988 [JP] Japan .................. 63-98324

[51] Int. Cl.5 ............................. G06G 7/48
[52] U.S. Cl. .................................. 364/578
[58] Field of Search .......... 364/578, 474.24, 151, 364/468, 551.01, 551.02, 552, 478, 801, 802, 570, 550

[56] References Cited

U.S. PATENT DOCUMENTS

| 4,512,747 | 4/1985 | Hitchens et al. | 364/578 |
| 4,604,718 | 8/1986 | Norman et al. | 364/578 |
| 4,796,194 | 1/1989 | Atherton | 364/468 |
| 4,827,427 | 5/1989 | Hyduke | 364/578 |
| 4,833,617 | 5/1989 | Wang | 364/578 |

FOREIGN PATENT DOCUMENTS 61-237162 10/1986 Japan .
62-135958 6/1987 Japan .

Primary Examiner—Parshotam S. Lall
Assistant Examiner—Michael Zanelli
Attorney, Agent, or Firm—Kenyon & Kenyon

[57] ABSTRACT

A simulation method includes a step of modifying a model in a simulation process, a step of detecting elements influenced by the model modification, and a step of performing a resimulation process while returning to the earliest one of the influenced elements. According to the disclosed method, a resimulation process associated with the model modificaiton can be realized in a short time without the inconvenience of the prior art in which the resimulation is carried out with a waste of time even for elements which are not influenced by the model modification or elements which need not to be subjected to the resimulation.

14 Claims, 9 Drawing Sheets

F I G. 3

| PRODUCT | 1ST STEP | | 2ND STEP | | 3RD STEP | | |
|---|---|---|---|---|---|---|---|
| | EQUIPMENT | ST | EQUIPMENT | ST | EQUIPMENT | ST | |
| A | 1 | 10 | 2 | 30 | | | |
| B | 2 | 20 | 1 | 10 | | | |
| C | 3 | 40 | 1 | 20 | 2 | 10 | |
| D | 3 | 20 | | 10 | | | |
| --- | --- | --- | | | | | |

FIG.5

| EQUIPMENT | STATE | WORK COMPLETION INSTANT |
|---|---|---|
| 1 | OUT OF USE | 0 |
| 2 | IN USE | 100 |
| 3 | IN USE | 170 |

FIG.6

| WAIT | NAME OF WAITING PRODUCT | | | | | |
|---|---|---|---|---|---|---|
|  | 1 | 2 | 3 | 4 | 5 | 6 |
| 1 |  |  |  |  |  |  |
| 2 | A |  |  |  |  |  |
| 3 | D | E | G |  |  |  |

FIG.7

| PRODUCT | LOCATION OF EQUIPMENT | STATE |
|---|---|---|
| A | 2 | WAIT |
| B | 2 | WORK |
| C | 3 | COMPLETION |
| ⋮ | ⋮ | ⋮ |

| INSTANT (F) | PRODUCT | LOCATION | STATE |
|---|---|---|---|
| 0 | A | 1 | START |
| 0 | B | 2 | START |
| 0 | C | 3 | START |
| 10 | A | 1 | COMPLETION |
| ⋮ | ⋮ | ⋮ | ⋮ |

FIG.10

| EQUIPMENT | INFLUENCE |
|---|---|
| 1 | ABSENT |
| 2 | ABSENT |
| 3 | PRESENT |

FIG.11

| WAIT | INFLUENCE |
|---|---|
| 1 | ABSENT |
| 2 | ABSENT |
| 3 | PRESENT |

FIG.12

| PRODUCT | INFLUENCE |
|---|---|
| A | ABSENT |
| B | ABSENT |
| C | PRESENT |
| ⋮ | | ns
SIMULATION METHOD FOR MODIFIABLE SIMULATION MODEL

BACKGROUND OF THE INVENTION

The present invention relates to a discrete (or discontinuous) event model computer simulation method and an apparatus for estimating the optimum production conditions at the scene of production, and more particularly to such a simulation method and apparatus suitable in the case where the modification of a simulation model is made in a trial and error manner.

JP-A- No. 62-135958 has disclosed a simulation system in which a process of simulation is stored and the results of simulation are produced as outputs on the basis of the stored contents. JP-A- No. 61-237162 has disclosed a simulation system in which a simulation model is. partially modified and simulation is thereafter performed again. More especially, all possible events which may occur are preliminarily determined in performing the first simulation. Thereafter, when the simulation model is modified, calculation is again made for only events which have any change induced by the model modification.

However, in the case of the simulation process storing system disclosed by the JP-A- No. 62-135958, the simulation process is merely stored or the stored contents are not utilized for a "processing for returning" of the simulation process. The term of "processing for returning" means that the simulation process is turned back to the previous or older instant (or point) of time and the simulation process is again performed starting from the returned point of time. In the simulation system of the JP-A- No. 62-135958, resimulation will be made in such a manner that the simulation process is returned to a start point thereof and simulation is again performed starting from the start point. In the simulation system disclosed by the JP-A- No. 61-237162 in which the results of a (first) simulation process before model modification are used for a (second) simulation process after model modification, the simulation process after model modification requires a longer calculation time as compared with the simulation process before model modification in the case where the influence of model modification extends over a wide area. In the case where it is estimated or presumed that the simulation process after model modification needs a calculation time longer than the simulation process before model modification, the simulation process after model modification is stopped but must be continued in a simulation manner performed before model modification.

In addition to the above-mentioned inconveniences, the following problem exists in the case where the production conditions at the scene of production are simulated. Namely, in the scene of production, the capacity of a certain production or manufacturing equipment may not be changed at just any point of time in the course of simulation but must be changed at a specified point of time (for example, early morning of Friday) during a simulation period (for example, from Monday to Friday). In such a case, it is required that the simulation process is returned from the course of the simulation process (for example, about 10 a.m. of Friday) to the specified point of time. However, in the conventional method, the simulation process is again performed or retraced from a start point thereof and hence a lot of time is consumed for unnecessary simulation process.

SUMMARY OF THE INVENTION

An object of the present invention is to eliminate a waste of time for a retrace of a simulation process from a start point thereof in the case where a simulation model is modified. According to the present invention a portion influenced by the model modification is detected so that the simulation process is turned back to that detected portion and resimulation is carried out for only the detected portion and the subsequent portions. Accordingly, the present invention can remove the inconvenience that a resimulation process is carried out with a waste of time even for portions which are not influenced by the model modification.

The above object can be achieved in such a manner that the transitions or changes of the state of a model successively occuring in the course of a simulation process are stored in parallel with the simulation process. It can be also achieved in such a manner that in carrying out a resimulation process after model modification, modification influence judgement data are used for judging whether or not the model state transitions in the simulation process before model modification can be utilized.

A simulation system comprises a state transition storage table provided for each of the previous or preceding simulation processes and the present or current simulation process and for storing each of the model state transitions as an in-simulation or internal instant (or point) of time and a state after transition. The system also includes a modification influence judgement table provided for each of state transition on elements (for example, product, equipment and wait) for judging which of the state transitions in the state transition storage table becomes unusable upon resimulation, whereby a processing for returning and a processing for resimulation are carried out by virtue of the state transition storage table and the modification influence judgement table.

More particularly, the simulation model preliminarily stored is successively changed or altered in state with the progression of the simulation process. Each time the state of the model is altered, an internal instant of time at which the transition occurs and the contents of the transition (for example, a waiting state at certain "wait" for a certain product is over and a processing or work for that product is started at a certain equipment) are stored in the state transition storage table. Thus, the model state is successively changed while the state transitions are stored.

When a need of model modification and resimulation is caused in such situations, the repetition of the above processing is stopped and the simulation process is interrupted once. Thereafter, the simulation process is turned back. The processing for returning includes reading out the contents lastly stored in the state transition storage table to replace the internal instant of time of occurrence of the read state transition by the current internal instant of time. Thereby, the in-simulation instant of time is turned back to the instant of time of occurrence of the read state transition. At the same time, the stored state transition (for example, a waiting state at certain "wait" for a certain product is over and a processing for that product is started at a certain equipment) is turned back to a model in which a reverse state transition (for example, a processing for a certain product at a certain equipment is stopped and that product is linked to the head of "wait") is stored. As a result, return corresponding to only one state transition is effected. The repetition of such processing for returning allows to return the simulation to a desired internal instant of time.

In carrying out the resimulation after model modification, the internal instants of time of occurrence of state transitions and the states after transition upon the preceding simulation process are read one by one from the state transition storage table for the preceding simulation process. In the case where the element (for example, product, equipment and "wait") of the read state transition (for example, a processing for a certain product at a certain equipment is finished and that product waits at the next "wait") encounters no influence of the partial model modification currently made, that is, in the case where a region of the modification influence judgement table corresponding to that element has no influence, the preceding simulation process is utilized, as it is, on the assumption that the same state transition having occurred upon the preceding simulation process occurs also in the current simulation process. In other words, it is possible to omit a processing of the problem of "when will the processing for which product start or end at which equipment?", that is, a processing for calculation of a work time and a processing for selection of a product to be processed and an equipment to be used (hereinafter referred to as normal simulation process). However, in the case where one or more elements is influenced by the model modification, the preceding simulation process cannot be utilized and the normal simulation process is carried out. As is apparent from the foregoing, when a part of the model is modified, the modification exerts influence on only some elements with the most of elements being not influenced by the model modification. As a result, it is possible to reduce the normal simulation process and to shorten a calculation time. This is because the normal simulation process requires a lot of calculation time for table comparison of many times for searching which equipment is out of use while a time required for table comparison calculation of several times suffices in the case of utilizing or following the preceding simulation process.

At the beginning, the influence of model modification is limited to only an element relevant to the model modification. However, with the progression of simulation the influence may extend to elements which are not directly relevant to the model modification. For example, supposing a model modification in which the processing capacity of a certain production equipment is changed, the model modification exerts influence on any product which passes through or is processed by that equipment. If the product thus influenced is further processed by another equipment, the model modification also exerts influence on the other equipment. Each time the influence of model modification is imposed, the corresponding equipment or product in the modification influence judgement table is brought or set to a state that the influence is "present".

BRIEF DESCRIPTION OF THE DRAWINGS

FIG. 3 is a table exemplifying a model which an input.

FIGS. 5, 6 and 7 respectively show an equipment table, a wait table and a product table which are elements of a model storage table shown in FIG. 1.

FIGS. 10, 11 and 12 respectively show an equipment table, a wait table and a product table which are elements of a modification influence judgement table shown in FIG. 1.

DETAILED DESCRIPTION OF THE PRESENT INVENTION

Embodiments of the present invention will now be explained by virtue of FIGS. 1 to 14.

Figure 1:
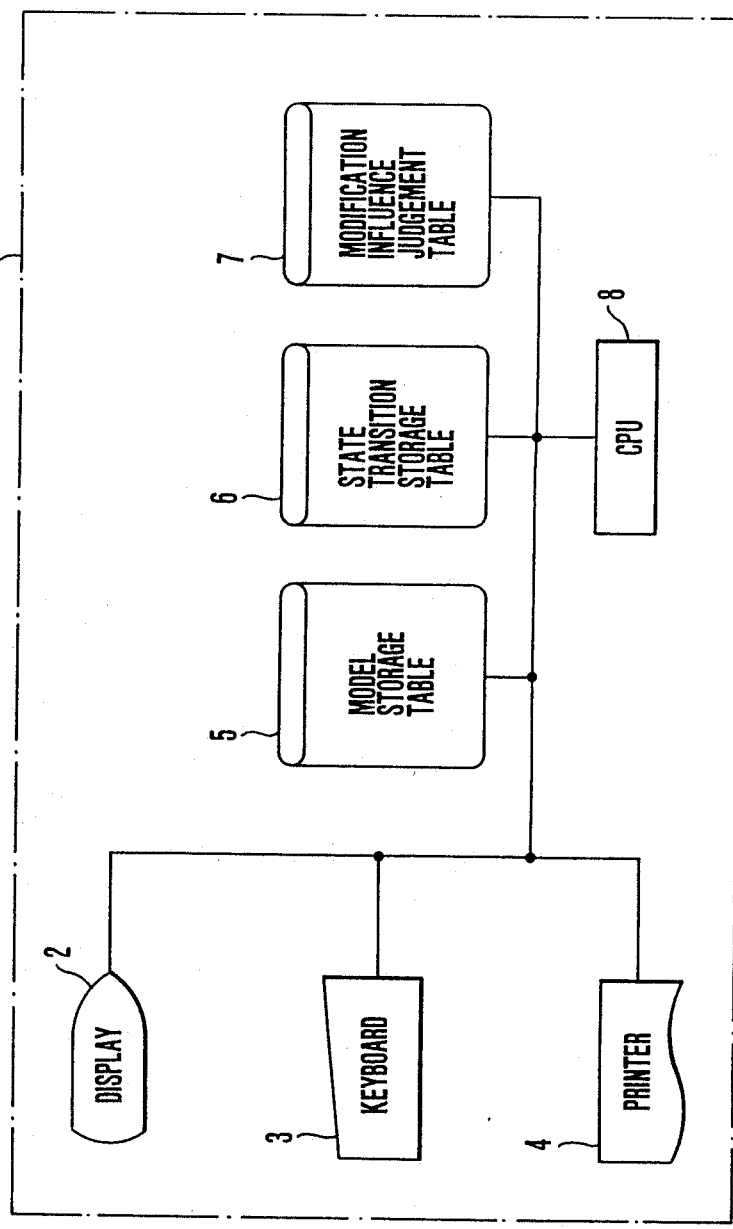
FIG. 1 is a schematic block diagram showing a construction or simulation for embodying a simulation method according to the present invention.
Figure 2:
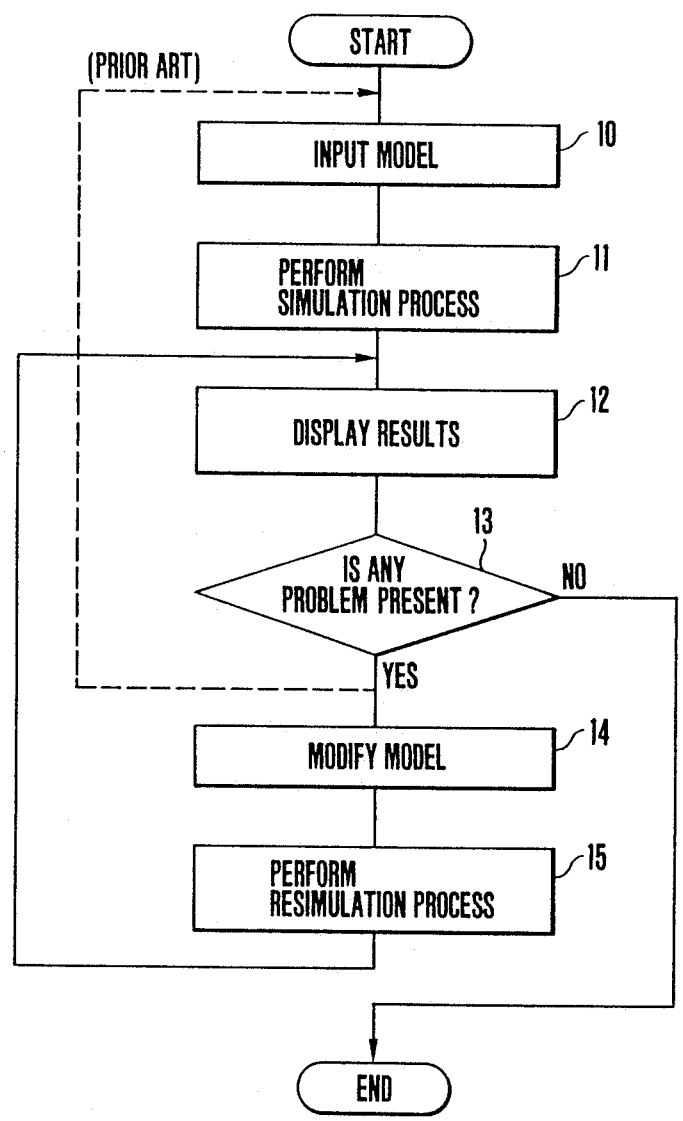
FIG. 2 is a flow chart showing an outline of processing in the simulation method according to the present invention.

Explanation will be first made of a simulator according to the present invention. FIG. 1 shows the whole systematic configuration of the simulator as an example implemented supposing the case where the production conditions at the scene of production in factory are simulated. As shown in FIG. 1, the simulator 1 comprises a CRT display 2 and a keyboard 3 which are used to input a simulation model and the CRT display 2 and a printer 4 which are used to display or indicate the results of simulation The simulator 1 further comprises a model storage table 5 for storing a simulation model, a state transition storage table 6 for storing an instant of time of occurrence of each state transition in a simulation process performed before the partial modification of a model, together with a name of equipment, a name of product and a state (start or completion of work) after transition, and a modification influence judgement table 7 for storing the presence/absence of influence of model modification. A CPU 8 operates on or refers to those tables to proceed with a simulation process. An outline of a flow of the processing for simulation is shown in FIG. 2. In the prior art, a "processing for returning" or a process by which a resimulation starting point is calculated and returned to is not carried out but a resimulation process is performed from a start point of the simulation, as shown by dotted line in FIG. 2.

Figure 4:
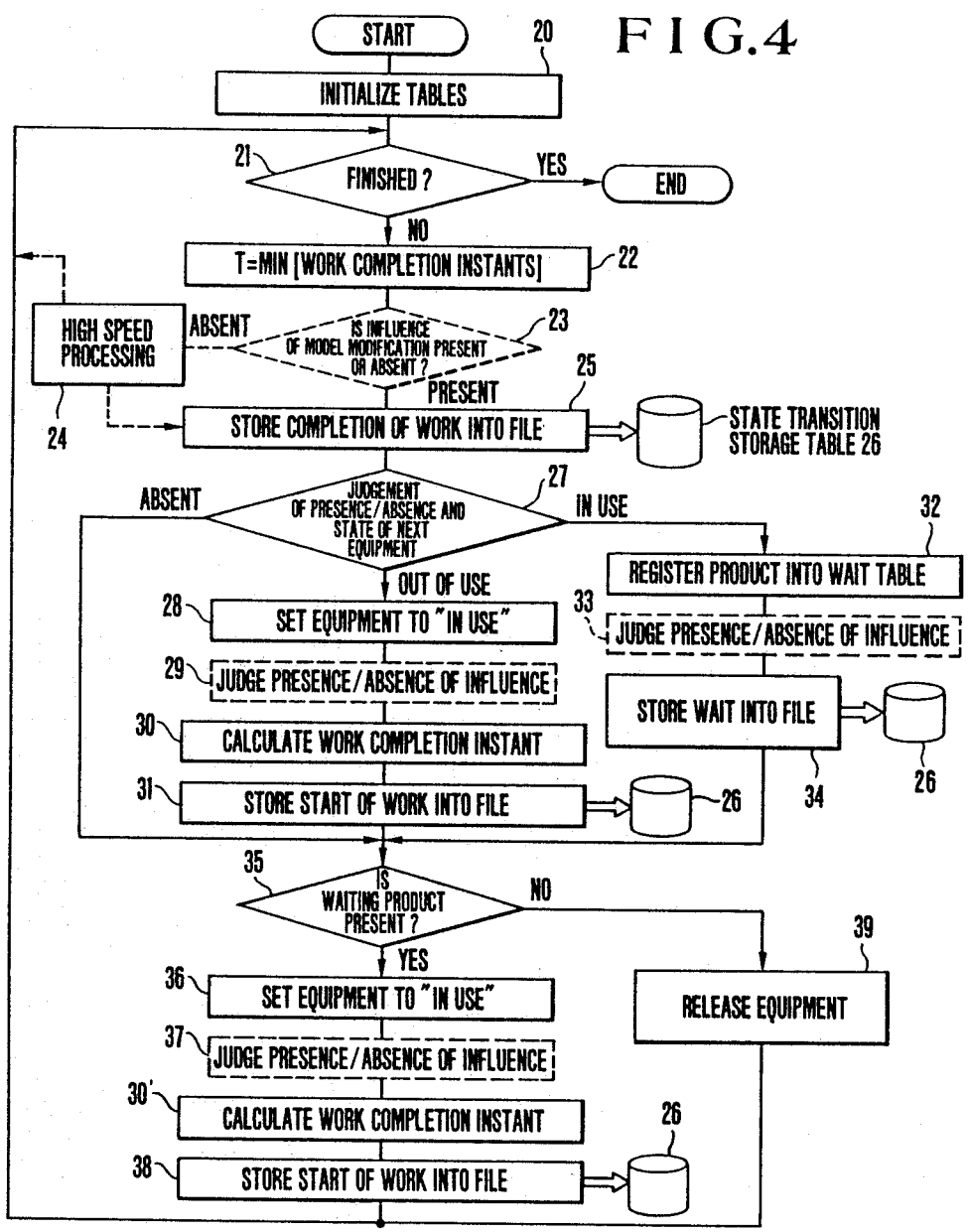
FIG. 4 is a flow chart for making further detailed explanation of the simulation method according to the present invention.

In the processing flow shown in FIG. 2, step 10 includes inputting a model as an object to be simulated. A model inputting manner is shown in FIG. 3. As shown in FIG. 3, input information includes the names (A, B, C, . . . in the shown example) of products to be subjected to throughput and information regarding how each product should be worked up, i.e. which production equipments (equipments 1 to 3 in the shown example) the products are to be subjected to and for how long in minutes in this example. The work minutes are inputted in terms of ST (standard time). The order of work for each product is established to be 1st step→2nd step→3rd step. For example, as for product A, it is first processed by the equipment 1 for 10 minutes and thereafter processed by the equipment 2 for 30 minutes. Based on the model thus inputted, a simulation process is performed in step 11. A flow of the simulation process is shown in FIG. 4. Five steps 23, 24, 29, 33 and 37 indicated by dotted boxes in FIG. 4 are used after model modification and detailed explanation thereof will be made later.

In the simulation process shown in FIG. 4, step 20 includes initializing an equipment table (see FIG. 5), a wait table (see FIG. 6) and a product table (see FIG. 7) which are elements of a model storage table. The equipment table contains for each equipment the name of that equipment, a state of "in use" or "out of use" indicative of whether the equipment is used (in use) or is not used (out of use), and an instant of time when a work by the equipment is completed. The equipment table is initialized so that all the states of equipments extracted from the model storage table are set to "out of use" and the work completion instant of time of each equipment is zero. The wait table contains the name of each wait given corresponding to the name of equipment and the name of product(s) waiting at that wait. The wait table is initialized so that all the names of waiting products are cleared. The product table contains the name of each product, the location or name of an equipment at which that product is being laid, and the state ("wait, work" or "completion") of the product at that location. In initializing the product table, the names of equipments for the 1st step are read out from the model storage table in the order of products registered therein. If the read equipment is out of use, the state of the corresponding equipment in the equipment table is set to "in use" and the ST of the corresponding product at the 1st step in the model storage table is introduced into the equipment table as the work completion instant of time for that equipment. Further, the location of equipment for the corresponding product in the product table is set to the location of equipment at the 1st step and the state of that product in the product table is set to "work". On the other hand, if the read equipment is in use, the corresponding product is registered into the wait table at a column corresponding to an equipment at the 1st step for the product in the model storage table. Further, the location of equipment for the corresponding product in the product table is set to the location of equipment at the 1st step and the state of that product in that product table is set to "wait". The above processing is made for all products in the model storage table. After this processing has been completed, the internal instant of time of the simulator (or in-simulation instant of time), that is, the instant of time in the simulator is set to zero, thereby terminating a preprocessing for simulation.

In Step 21, the judgement is made of whether or not the works for all products have been finished. If no finish or the mid course of simulation is decided, the smallest one among the work completion instants of time in the equipment table except zero is selected and set as the next internal instant of time (see step 22). Through step 22, the next equipment at which a work will be finished is selected and the internal instant of time is advanced up to the instant of time of completion of the work at the next equipment. Since the work is finished at the advanced instant of time, this state transition is stored simultaneously with the completion of the work into a state transition storage table 26 in a format shown in FIG. 8 (see step 25). The storage format includes the internal instant of time of occurrence of the transition to the state of "completion", the name of the corresponding product for which the work is completed, the name of or location of the corresponding equipment, and a state indicative of the state of completion after transition. The state transition storage table in which the state transition is stored in such a format is utilized in a process of resimulation which will be explained in later. How the model has been modified or changed in the simulator can be known from the state transition storage table. Namely, the change or behavior of the model can be reproduced later.

A product concerned in work completion is to be sent to the next equipment in accordance with information stored in the model storage table. If step 27 decides that the next equipment is absent, that product is considered to have been fully completed in work and is excluded from being characterized as an object for subsequent processing. In the case where the next equipment is out of use, the state of the corresponding equipment in the equipment table is set to "in use" through step 28 and a work completion instant of time is thereafter calculated in step 30. Further, the start of work for the corresponding product is additionally stored in the state transition storage table 26 in step 31. On the other hand, in the case where the next equipment is in use, that product is registered in step 32 into the wait table at a position after the last one of products waiting in the wait table and the state transition to "wait" is thereafter registered into the state transition storage table 26 in step 34. In this manner, a processing for the product concerned in work completion at the set internal instant of time has been finished. However, an equipment concerned in work completion remains out of use. Therefore, a new work is to be started at that equipment. If step 35 decides that any product waiting before the equipment concerned in work completion is present, the leading one of products registered in the wait table is subjected to work at that equipment. This processing is made in step 36 in such a manner that the state of the corresponding product in the product table is set to "work" and the names of waiting products in the wait table are advanced one by one. Thereafter or in a similar manner to the above, a work completion time is calculated in step 30' and the start of work is additionally stored into the state transition storage table 26 in step 38. On the other hand, if step 35 decides that no product waiting before the equipment concerned in work completion is present, the equipment is released in step 39. There are known various methods of taking out products which are in state of "wait". For example, a method is known in which the products are taken out in order of ST's from the shortest one to the longest one or successively starting from a product having the least number of remaining steps. A processing time for take-out and the producibility may greatly change depending on the taking-out method. In the present embodiment, a first-in first-out method is used.

By the above processing, one step of manufacture process for products is finished and information concerning the transitions of products has been stored in the state transition storage table. The simulation process is advanced through the repetition of a similar processing.

Figures 8, 9:
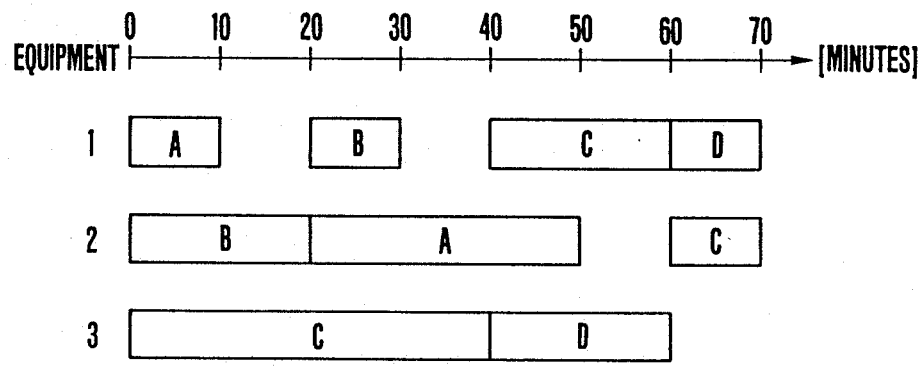
FIG. 8 is a view showing the contents of a state transition storage table.
FIG. 9 is a view showing a displayed example of the results of a simulation process.

In step 12 (see FIG. 2), the results of the simulation process are displayed, for example, on the display 2 (see FIG. 1), at the point of time when the simulation process has been finished. For example, the results as shown in FIG. 9 are obtained. In the example shown in FIG. 9, the leftmost headline along a longitudinal direction represents the names of equipments, the abscissa represents the internal instants of time, and each rectangle represents the start and end of work for a product written therein. In step 13, an operator judges on the basis of the displayed contents whether any problem exists from a view-point of manufacturing. If the operator regards the processing for the product C at the 1st step as being too long, the operator changes the ST of the product C at the 1st step from 40 minutes to, for example, 30 minutes, that is, the model is partially modified at step 14.

To carry out the simulation process again from a start point thereof when only a slight change of model as mentioned above is made is a waste of time. In the present invention, the speed-up for resimulation is effected by utilizing the state transition storage table in which the state transitions in the preceding simulation process are stored. The resimulation is performed at a high speed by simplifying a processing for taking out waiting products, a processing for calculating the work completion instants of time and a processing for determining the shortest work completion instant of time.

Figure 13:
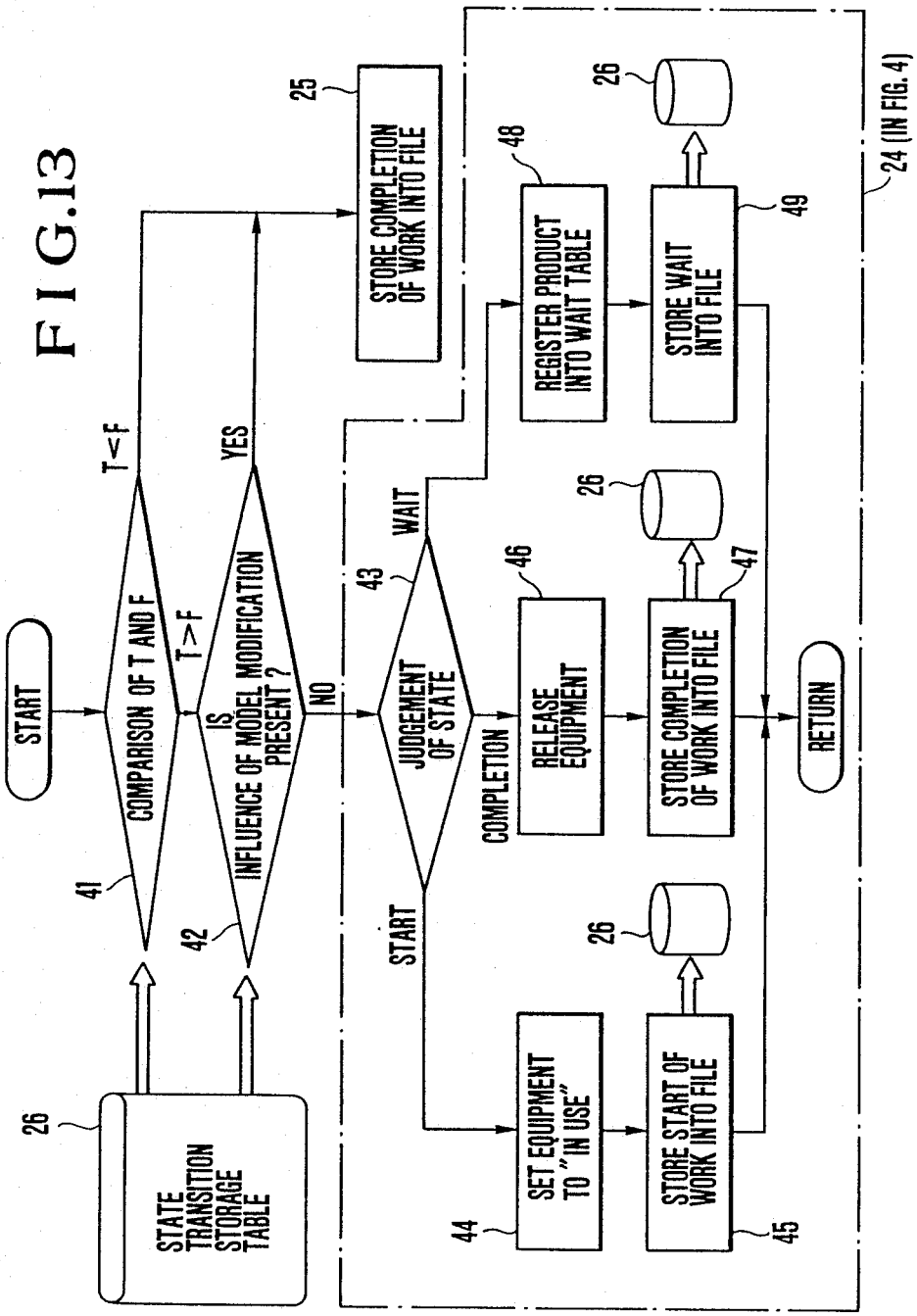
FIG. 13 is a flow chart showing the details of steps 23, 24 and 25 in the flow chart shown in FIG. 4.

Explanation of the resimulation process will now be made in detail. In the case where the results of the preceding simulation are unfavorable, the model is modified in step 14 and a simulation process is again performed for the modified model in step 15. Prior to the resimulation process, the presence/absence of influence of model modification is registered in a modification influence judgement table in order to judge whether or not the state transition upon the preceding simulation process is influenced by the model modification. In the case where the absence of influence of model modification is decided on the basis of the modification influence judgement table, the preceding simulation process is utilized as it is. More particularly, the column of influence in an equipment modification influence judgement table as shown in FIG. 10 are all set to "absent" and the columns of influence in a wait modification influence judgement table as shown in FIG. 11 are all set to "absent". Further, as for a product modification influence judgement table as shown in FIG. 12, the columns of influence for products excepting the product C are set to "absent" and the column of influence for the product C is set to "present". After the modification influence judgement table has been initialized, the resimulation is performed. The flow of a processing for the resimulation process is similar to the flow shown in FIG. 4 but includes steps 23, 24, 29, 33 and 37 which are newly added. Explanation of these steps added for the resimulation process will now be made. In steps 29, 33 and 37, the judgement is made of whether or not the influence of model modification expands. In step 23, the judgement is made of whether or not the preceding simulation process can be utilized, that is, whether the influence of model modification is present or absent. In the case where the influence of model modification is absent, a high-speed processing (the flow of which is shown in FIG. 13) is carried out in step 24. On the other hand, in the case where the influence of model modification is present, the preceding simulation process is not utilized but a new simulation process is performed. However, the influence of model modification may expand from products to waits and/or equipments or from equipments and/or waits to products. Therefore, in steps 29, 33 and 37, the judgement is made of the presence/absence of a possibility that an equipment, wait or product being influenced by the model modification newly exerts influence on another equipment, wait or product. If a product concerned in work completion is being influenced by the model modification, the model modification exerts influence on the next equipment. On the other hand, if the next equipment is being influenced by the model modification, the model modification exerts influence on the product concerned in work completion. Accordingly, in step 29, whether or not a product concerned in work completion and the next equipment are being influenced by the model modification is judged on the basis of the product modification influence judgement table and the equipment modification influence judgement table. When the decision of the presence of influence is made, the column of influence for the relevant product or equipment in the product or equipment modification influence judgement table is set to "present". Similarly, the presence/absence in influence between a product concerned in work completion and a wait and the presence/absence in influence between a waiting product and an equipment concerned in work completion are examined in steps 33 and 37, respectively, so that the modification influence judgement tables are updated. In this manner, whether or not the influence of model modification is expanding is occasionally examined.

Now, the high-speed processing upon the resimulation process or an algorithm of step 24 will be explained with reference to of FIG. 13. According to this processing, the results of a simulation process to be now made can be obtained at a high speed by utilizing the results of the preceding simulation process. As shown in FIG. 13, step 41 makes a comparison in magnitude between T (the shortest one among work completion instants of time at equipments influenced by the model modification) and F (the instant of time of occurrence of state transition stored at the head portion of the state transition storage table for the preceding simulation process). The search of T can be made fast since the number of times of calculation required for the search is less as compared with the case of a normal simulation process.

Through the comparison in step 41, it is possible to know an equipment at which a work will be completed at a future nearest to the present point of time. In the case where T is smaller than F, the process step is returned to the normal simulation process or step 25 of FIG. 4 since the equipment is one which is influenced by the model modification. On the other hand, in the case where T is larger than F, the process step is transferred to the high-speed processing since the equipment is one which is not influenced by the model modification.

The above-mentioned processing is one in which the next equipment at which a work will be completed is located or selected to advance the internal instant of time. Thereafter, information concerning the state transition stored at the head portion of the state transition storage table is read out from the table and the state transition is deleted from the table. In step 42, whether or not the product and location (equipment or wait) in the read state transition information have already been influenced by the model modification is judged on the basis of the modification influence judgement table. In the case where the influence of model modification is present, the process step is returned to the normal simulation process. On the other hand, in the case where the product and location are not influenced by the model modification, the preceding simulation process, that is, the read state transition information is utilized as it is. In that case, step 43 judges whether the item of state in the read state transition information represents "start", "completion" or "wait". The process step branches into steps 44, 46 and 48 in accordance with "start", "completion" and "wait" in which the equipment table, the wait table and the product table are updated. Subsequently, in step 45, 47 or 49, the contents of updating are additionally stored into the state transition storage table for the current simulation process. The state transition storage table for the current simulation process is used also for storage into a state transition storage table in the normal simulation process.

After the resimulation process has been thus performed, the results of resimulation are displayed in a manner similar to that early mentioned. Depending on the displayed contents, the further modification of model and simulation for the modified model may be repeated. Through such a repetition of processing, the production conditions are found out which can be regarded as being optimum from the view-point of manufacturing.

In the foregoing, the resimulation process has been explained. Finally, a processing for returning will be explained.

In the actual simulation process, it is not easy to interrupt the simulation process at a desired location where the model modification or the like is to be made. In the case where the simulation process is stopped at a location in front of the location where the interruption is desired, the model modification or the like can be made in such a manner that the simulation process is advanced little by little to the desired location and is interrupted thereat. However, in the case where the simulation process is stopped going past the desired location, the conventional simulation system has no measure other than a method in which simulation is carried out again from the start point. On the other hand, according to the present invention, it is possible to turn back to the desired location even in the case where the simulation process goes past the desired location.

Figure 14:
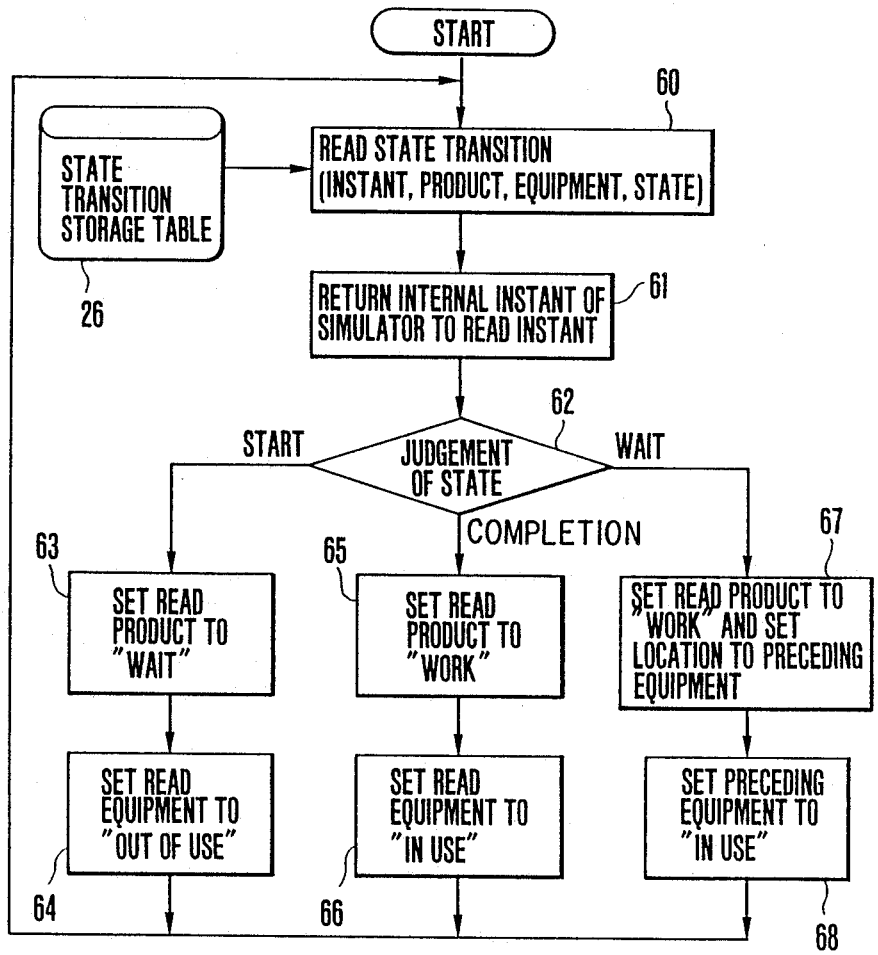
FIG. 14 is a flow chart showing a processing for returning in simulation.

FIG. 14 shows the flow of a processing for returning according to the present invention. The processing for returning after the interruption of the simulation process is carried out in steps 11 and 15 in the whole flow of the simulation process shown in FIG. 2. Referring to FIG. 14, in step 60, the state transition information (including instant of time, product, location or equipment, and state) stored at the last portion of the state transition storage table is read out. The processing for returning is performed on the basis of the read state transition information. First or in step 61, the internal instant of time of the simulator is returned to the instant of time contained in the read information. The subsequent process step branches through step 62 into steps 63, 65 and 67 in accordance with a state after transition indicated by the read state transition information. In the case where the read state after transition indicates "start", that is, in the case where a work is to start at that instant of time, the state in the product table of a product indicated by the read state transition information is set to "wait" and that product is registered at the leading portion of the wait table for an equipment indicated by the read state transition information (step 63). Further, in step 64, the state in the equipment table of the equipment concerned in the read state transition is set to "out of use". In the case where the read state after transition indicates "completion", the state in the product table is set to "work" (step 65) and the state in the equipment table is set to "in use" (step 66). Thereafter, the work completion instant of time in the equipment table is set to the present internal instant of time. In the case where the read state after transition indicated "wait", the state in the product table is set to "work" and the location in the product table is set to a location in a step preceded by one on the inputted model table (step 67). Thereafter or in step 68, the state in the equipment table for an equipment indicated by the read state transition information corresponding to the step preceded by one is set to "in use", and the work completion instant of time in the equipment table for that equipment is set to the present internal instant of time. The state of the simulation model can be returned by repeating the above-mentioned processing on the basis of the state transition storage table.

As is apparent from the foregoing explanation, according to the present invention, a time for calculation in a simulation process can be shortened in the case where the degree of partial modification of a simulation model is small and the influence of the partial model modification does not extend over a wide area. Particularly, by reducing the time of times of processing for taking out products in state of "wait" which processing requires a long calculation time, the overall calculation time can be greatly shortened. Also, since a calculation time required for determining the next work completion instant of time is considerably shortened, a calculation time in the simulation can be shortened. Further, since the simulation can be repetitively carried out in a short time, the saving of personal expenses for an operator making a judgement on the results of the simulation can be realized. Even in the case where the influence of the model modification extends over a relatively wide area, the judgement of whether or not the course of the preceding simulation process can be utilized only requires referring to the modification influence judgement table two times (the product and equipment modification influence judgement tables or the product and wait modification influence judgement tables). Therefore, the increase of the processing time associated with such a judgement is almost negligible.

That the simulation process can be easily returned to any given time makes it possible to cope with the over-advance or undesirable advance of the simulation process with good interactiveness and responsiveness.

As has been explained, the present invention provides an effect that it is possible to return from the course of a simulation process to a location of the simulation process at any instant of time and a resimulation process associated with the modification of a model after returning can be rapidly performed. In the scene of production where belt conveyors are used, the production conditions can be easily simulated since the flow of working pieces is well organized. The effect of the present invention is great when it is applied to a model such as the scene of production or working by machines where the flow of work pieces is complicated.

What is claimed is:
1. A simulation method, comprising the steps of:
storing a modifiable discrete simulation model;
producing discrete future conditions of the model by exercising the model in a simulation process;
detecting transitions of states of the model arising when producing discrete future conditions by exercising the model;
storing said transitions where each transition is an in-simulation instant of time and a transition state; and
after an interruption of the simulation process occurs while said model is in a first state, returning to a second state of the model, which preceded said first state, said step of returning comprising, reading out a stored transition state immediately preceding said first state, determining if said second state has been achieved and if it has not been achieved continuing to read out the stored immediately preceding transition states until said second state is achieved.

2. The method of claim 1 wherein said in-simulation instants of time and said transition states are stored in a state transition storage table.

3. The method of claim 1 further comprising the step of:

determining influences to the model resulting from a modification of the model;

storing said modification influences as modification influence judgement data; and beginning a resimulation of said model, as modified, beginning at said second state.

4. The method of claim 3 wherein said resimulation includes determining where said stored transitions from a preceding simulation can be used by using said modification influence judgement data.

5. The method of claim 4 wherein said modification influence judgement data are stored in a modification influence judgement table.

6. A simulation method, comprising the steps of:

storing a modifiable discrete simulation model;

producing discrete future conditions of the model by exercising the model in a simulation process;

detecting transitions of states of the model arising when producing discrete future conditions by exercising the model;

storing said transitions where each transition is an in-simulation instant of time and a transition state wherein said in-simulation instants of time and said transitions states are stored in a state transition storage table;

after an interruption of the simulation process occurs while said model is in a first state, returning to a second state of the model, which preceded said first state, said step of returning comprising, reading out a stored transition state immediately preceding said state, and determining if said second state has been achieved and if it has not continuing to read out stored immediately preceding transition states until said second state is achieved;

determining influences to the model resulting from modification of the model;

storing said modification influences as modification influence judgement data in a modification influence judgement table; and beginning a resimulation of said model, as modified, beginning at said second state;

wherein said resimulation includes determining where said stored transitions from a preceding simulation can be used by using said modification influence judgement data.

7. A simulation method comprising steps of:

storing a simulation model of a production line;

producing discrete future conditions of said production line by exercising the model in a simulation process;

detecting transitions of a state of said production line arising when producing discrete future conditions by exercising the model;

storing said transitions which are each represented by an in-simulation instant of time and a transition state; and after an interruption of the simulation process occurs while said production line is in a first state at a first portion of said model, returning to a previous state of the production line at a second portion of said model, earlier in time than said first portion of the model, said step of returning comprising the steps of, reading out a stored transition state immediately preceding said first state, determining if said second state has been achieved, and if it has not been achieved then continuing to read out stored immediately preceding transition states until said second state has been achieved.

8. The simulation method of claim 7 wherein said model comprises production information determining a product appearing on said production line, stations along said production line, and a timing relationship along said production line.

9. The method of claim 8 wherein said production information is stored in a model storage table and said transitions are stored in a state transition storage table.

10. The method of claim 8 further comprising the step of modifying said production information during said interruption of a resimulation process.

11. A simulation method comprising the steps of:

storing a simulation model of a production line;

producing discrete future conditions of said production line by exercising the model in a simulation process;

detecting transitions of a state of said production line arising when producing discrete future conditions by exercising the model;

storing said transitions which are each represented by an in-simulation instant of time and a transition state;

after an interruption of the simulation process occurs while said production line is in a first state at a first portion of said model, returning to a previous state of the production line at a second portion of said model, earlier in time then said first portion of the model, said step of returning comprising the steps of, reading out a stored transition state immediately preceding said first state, determining if said second state has been achieved, and if it has not been achieved then continuing to read out stored immediately preceding transition states until said second state has been achieved;

determining influences to said production line resulting from modification to said model;

storing said modification influences as modification influence judgement data; and resimulating the production line process using said modified model beginning at said second state.

12. The method of claim 11 wherein said step of resimulating includes determining where, by using said modification influence judgement data said stored transitions from the preceding simulation can be used in place of regenerating transitions.

13. The method of claim 12 wherein said model comprises production information determining a product appearing on the production line, stations along said production line, space and a timing relationship along said production line 14. The method of claim 13 wherein said production information is stored in a model storage table, said transitions are stored in a state transition storage table, and said modification influence judgement data are stored in a modification influence judgement data table.

* * * * *

UNITED STATES PATENT AND TRADEMARK OFFICE
CERTIFICATE OF CORRECTION

PATENT NO. : 4,967,386
DATED : 30 October 1990
INVENTOR(S) : Kazuhiko MAEDA et al.

It is certified that error appears in the above-identified patent and that said Letters Patent is hereby corrected as shown below:

| Column | Line | |
|--------|------|---|
| 2 | 34 | Delete "on". |
| 4 | 1 | After "which" insert --is--. |
| 4 | 3 | Before "further" insert --a--. |
| 4 | 35 | After "simulation" insert --.--. |
| 6 | 5 | After "in" insert --detail--. |
| 8 | 25 | Before "FIG. 13" delete "of". |
| 9 | 12 | Change "early mentioned" to --mentioned earlier--. |
| 11 | 6 | After "achieved" insert --,--. |
| 11 | 12 | Change "step" to --steps--. |
| 11 | 45 | After "not" insert --,--. |
| 12 | 55 | After "data" insert --,--. |

Signed and Sealed this

Twelfth Day of May, 1992

*Attest:*

DOUGLAS B. COMER

*Attesting Officer*  *Acting Commissioner of Patents and Trademarks*